United States Patent [19]

Tsukada et al.

[11] 4,272,607

[45] Jun. 9, 1981

[54] PHOTOSENSITIVE RESIN COMPOSITION

[75] Inventors: Katsushige Tsukada; Nobuyuki Hayashi; Hideo Yamada; Toshiaki Ishimaru; Hajime Kakumaru, all of Hitachi, Japan

[73] Assignee: Hitachi Chemical Company, Ltd., Tokyo, Japan

[21] Appl. No.: 782,378

[22] Filed: Mar. 29, 1977

[30] Foreign Application Priority Data

Mar. 30, 1976 [JP] Japan ................................ 51-35442

[51] Int. Cl.$^3$ ................................................ G03C 1/68

[52] U.S. Cl. .................................... 430/288; 430/285; 430/905; 204/159.15; 204/159.22

[58] Field of Search ........................ 96/115 P, 115 R; 430/288, 285, 905; 204/159.15, 159.22

[56] References Cited

U.S. PATENT DOCUMENTS

| | | | |
|---|---|---|---|
| 2,757,090 | 7/1956 | Neugebauer et al. | 96/115 R |
| 3,738,973 | 6/1973 | Augarten et al. | 96/115 R |
| 3,773,515 | 11/1973 | Yamashita et al. | 96/115 R |
| 3,795,640 | 3/1974 | Pande et al. | 96/115 R |
| 3,804,628 | 4/1974 | Osada et al. | 96/115 R |
| 3,859,099 | 1/1975 | Petropoulos et al. | 96/115 R |
| 3,881,935 | 5/1975 | Apellaniz | 96/115 R |
| 4,025,348 | 5/1977 | Tsukada et al. | 96/115 R |
| 4,028,108 | 6/1977 | Van Royen | 96/115 R |

FOREIGN PATENT DOCUMENTS 46-7703 2/1971 Japan .

*Primary Examiner*—Jack P. Brammer
*Attorney, Agent, or Firm*—Craig & Antonelli

[57] ABSTRACT

A photosensitive resin composition comprising (a) a linear polymer or copolymer having tetrahydrofurfuryl groups at side chains, (b) one or more photopolymerizable unsaturated compounds having at least two terminal ethylene groups, and (c) one or more sensitizers which initiate polymerization of said unsaturated compounds by irradiation of active light, has excellent storage stability and photosensitivity. The composition can produce permanent protective films having excellent resistance to solvents, heat resistance and the like and can be used as a solder resist and the like.

23 Claims, No Drawings

PHOTOSENSITIVE RESIN COMPOSITION

This invention relates to a photosensitive resin composition. More particularly, this invention relates to a photosensitive resin composition for producing protective films having excellent physical and chemical properties useful for producing printed circuit boards, precision treatment of metals, and the like.

There has been well known in the printed circuit board industry to use a permanent protective film having image (a solder resist) for the purpose of permanent protection of the circuit and inhibition of solder bridging when soldering parts. As such as resist, a printing resist containing as a major component a thermosetting resin such as an epoxy resin, an aminoplast resin and the like has been used. But said resist had defects in that it was very difficult to coat thickly, dimensional accuracy was low and the like.

Conventional photoresists, for example, poly (vinyl cinnamate) type resists, photopolymerization type resists, and the like are excellent in dimensional accuracy but poor in physical and chemical properties such as heat resistance, resistance to solvents, and the like, so that they cannot be used as solder resists.

On the other hand, photopolymerization type photosensitive compositions containing thermosetting resins such as epoxy resins as disclosed in, for example, Japanese Patent Application Kokai (Laid-Open) Nos. 144429/75, 144430/75 and 144431/75 are excellent in dimensional accuracy, resistance to solvents, heat resistance and mechanical properties and can be used as a solder resist for high density printed circuit boards, but improvement of storage stability of the compositions has been required.

It is an object of this invention to provide a photosensitive resin composition which has excellent storage stability and can produce protective films having excellent physical and chemical properties and being able to be used as a solder resist.

The present invention provides a photosensitive resin composition comprising (a) a linear polymer or copolymer having tetrahydrofurfuryl groups at side chains, (b) one or more photopolymerizable unsaturated compounds having at least two terminal ethylene groups, and (c) one or more sensitizers which initiate polymerization of said unsaturated compounds by irradiation of active light.

The linear polymer or copolymer having tetrahydrofurfuryl groups at side chains includes linear polymers having tetrahydrofurfuryl groups at side chains; linear copolymers having tetrahydrofurfuryl groups at side chains; linear copolymers having tetrahydrofurfuryl groups and hydroxyl groups at side chains; and linear copolymers having tetrahydrofurfuryl groups, hydroxyl groups and phosphorus-containing groups at side chains. Preferred linear polymers or copolymers having tetra hydrofurfuryl groups at side chains are those having molecular weight of 10,000 to 600,000.

The linear polymer having tetrahydrofurfuryl groups at side chains can easily be prepared by polymerizing a compound of the formula:

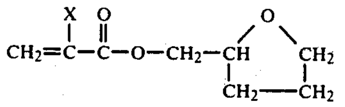

(I)

wherein X is a hydrogen atom, a lower alkyl group such as methyl, or a halogen atom such as chlorine, bromine or the like, using a conventional method. Examples of the compounds of the formula (I) are tetrahydrofurfuryl methacrylate, tetrahydrofurfuryl acrylate, and the like.

The linear copolymer having tetrahydrofurfuryl groups at side chains can easily be prepared by copolymerizing a compound of the formula (I) and one or more conventional copolymerizable vinyl monomers using a conventional method. Examples of the vinyl monomers are alkyl acrylates or methacrylates such as methyl methacrylate, butyl methacrylate, ethyl methacrylate, methyl acrylate, ethyl acrylate, butyl acrylate; acrylic acid, methacrylic acid, itaconic acid, styrene, α-methyl styrene, glycidyl methacrylate, t-butylaminoethyl methacrylate, dimethylamino methacrylate, 2,3-dibromopropyl methacrylate, acrylamide, tribromophenyl acrylate, and the like.

The linear copolymer having tetrahydrofurfuryl groups and hydroxyl groups at side chains can easily be prepared by copolymerizing a compound of the formula (I) and a monomer containing a hydroxyl group, for example, a compound of the formula:

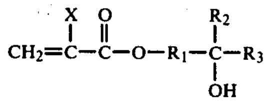

(II)

wherein X is as defined above; $R_1$ is a group of the formula

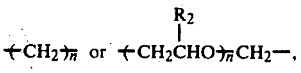

in which n is an integer of 1 to 20; $R_2$ is a hydrogen atom, a lower alkyl group or a group of the formula $-CH_2Cl$; and $R_3$ is a hydrogen atom, a lower alkyl group or a group of the formula $-CH_2OR_2$, and if required, together with one or more conventional polymerizable vinyl monomers as mentioned above using a conventional method.

Preferred examples of the compounds of the formula (II) are hydroxyalkyl acrylates or methacrylates such as 2-hydroxyethyl methacrylate, 2-hydroxyethyl acrylate, 3-chloro-2-hydroxypropyl methacrylate, 3-chloro-2-hydroxypropyl acrylate, 3-butoxy-2-hydroxypropyl acrylate, 3-butoxy-2-hydroxypropyl methacrylate and the like. These monomers containing hydroxyl groups can be modified with a dibasic acid compound such as phthalic anhydride and an alkylene oxide such as propylene oxide. An example of the modified compounds is a reaction product of 2-hydroxyethyl methacrylate-phthalic anhydridepropylene oxide (1/1/1 in molar ratio).

Other monomers containing hydroxyl groups such as hydroxyalkyl maleates, hydroxyalkyl itaconates, allyl alcohol, and the like can also be used.

In the linear copolymer having tetrahydrofurfuryl groups or tetrahydrofurfuryl groups and hydroxyl groups at side chains, it is preferable to contain the tetrahydrofurfuryl group in a proportion of 0.007 mole/100 g or more.

When a linear copolymer of tetrahydrofurfuryl methacrylate or (and) tetrahydrofurfuryl acrylate and a monomer containing a hydroxyl group and/or one or more vinyl monomers is used in the composition of this invention, there may be used the linear copolymer obtained by polymerizing a mixture of these monomers or alternatively there may be used a mixture of copolymers prepared individually, for example, a mixture of a copolymer of tetrahydrofurfuryl methacrylate and a vinyl monomer and a copolymer of tetrahydrofurfuryl acrylate and a vinyl monomer.

The linear copolymer having tetrahydrofurfuryl groups, hydroxyl groups and phosphorus-containing groups at side chains can easily be prepared by copolymerizing a compound of the formula (I), a monomer having a hydroxyl group such as a compound of the formula (II), and a phosphorus compound, and if required, together with one or more conventional polymerizable vinyl monomers as mentioned above using a conventional method.

The phosphorus compound to be used in this invention is a monofunctional monomer obtained by the reaction of the hydroxyl group-containing monomer as mentioned above with phosphoric anhydride, and if required together with a lower alcohol. The phosphorus compound can be represented by the formula:

$$CH_2=\overset{X}{\overset{|}{C}}-\overset{O}{\overset{\|}{C}}-O-(CH_2\overset{R_4}{\overset{|}{C}}HO)_n-\underset{\underset{OH}{|}}{\overset{\overset{OR_5}{|}}{P}}=O \qquad \text{(III)}$$

wherein X is as defined above; $R_4$ is a hydrogen atom, a lower alkyl group or a group of the formula $-CH_2Cl$; $R_5$ is a hydrogen or a lower alkyl group; and n is an integer of 1 to 20. Preferred examples of the phosphorus compounds of the formula (III) are 2-acid phosphoxyethyl methacrylate, 2-acid phosphoxyethyl acrylate, 3-chloro-2-acid phosphoxypropyl methacrylate, 3-chloro-2-acid phosphoxypropyl acrylate, and the like.

Among the linear copolymer having tetrahydrofurfuryl groups, hydroxyl groups and phosphorus-containing groups at side chains, useful ones showing excellent properties are those produced from (A) 2 to 90 parts by weight, preferably 5 to 40 parts by weight of the compound of the formula (I) having a tetrahydrofurfuryl group, (B) 1 to 20 parts by weight, preferably 2 to 10 parts by weight of the compound of the formula (II) having a hydroxyl group, (C) 0.02 to 1 part by weight, preferably 0.05 to 0.2 part by weight of the phosphorus compound of the formula (III), and (D) 0 to 85 parts by weight of the vinyl compound.

If the linear copolymer having tetrahydrofurfuryl groups, hydroxyl groups and phosphorus-containing groups at side chains is used in the photosensitive resin composition of this invention, photosensitivity, adhesion to metals and electrical properties are particularly improved.

As the photopolymerizable unsaturated compounds having at least two terminal ethylene groups (the second essential ingredient of the composition), there may be used acrylic acid esters of polyvalent alcohols and methacrylic acid esters of polyvalent alcohols, examples of the polyvalent alcohols being trimethylolpropane, trimethylolethane, pentaerythritol, 1,3-butylene glycol, 1,4-butylene glycol, 1,6-hexane diol, propylene glycol, tripropylene glycol, polypropylene glycol, ethylene glycol, polyethylene glycol, neopentyl glycol, dibromoneopentyl glycol, and the like; acrylic or methacrylic acid esters of alkylene oxide adducts of bisphenol A such as 2,2-bis(4-methacryloxyethoxyphenyl)propane, 2,2-bis(4-acryloxypropyloxyphenyl)propane, 2,2-bis(3,5-dibromo-4-acryloxyethoxyphenyl)propane, and the like; reaction products of methacrylic or acrylic acid and a compound having at least two epoxy groups such as cyclic aliphatic epoxy resins, epoxidized novolac resins, bisphenol A-epichlorohydrin type epoxy resins, and the like; reaction products of a diol monoacrylate or diol monomethacrylate and a diisocyanate; and derivatives of acrylic acid containing phosphorus such as trisacryloxyethyl phosphate.

There may also be used low molecular weight polyester resins having acryloyl groups and/or methacryloyl groups at end groups such as a condensation polymer of phthalic anhydride-neopentyl glycol-acrylic acid (in a molar ratio of 1:2:2), a condensation polymer of maleic acid-1,4-butylene glycol-methacrylic acid (in a molar ratio of 1:2:2), a condensation polymer of trimethylolpropane-phthalic anhydride-diethylene glycolacrylic acid (in a molar ratio of 1:3:3:3), a condensation polymer of adipic acid-neopentyl glycolacrylic acid (in a molar ratio of 1:2:2), and the like.

These unsaturated compounds may be used alone or as a mixture of two or more unsaturated compounds. A mixture of a trifunctional unsaturated compound with high crosslink density such as acrylic or methacrylic acid esters of polyvalent alcohols (e.g., pentaerythritol, trimethylolpropane, trimethylolethane, etc.) and a bifunctional unsaturated compound with low crosslink density such as acrylic or methacrylic acid esters of bivalent alcohols (e.g., polyethylene glycol, polypropylene glycol, polytetramethylene glycol, etc.), particularly a mixture of trimethylolpropane triacrylate and polyethylene glycol diacrylate (average molecular weight of polyethylene glycol being 1,000) is preferable to improve adhesion, resistance to solvents, resistance to chemicals, heat resistance and flexibility remarkably.

The third essential ingredient of the composition is one or more sensitizers which initiate polymerization of the above-mentioned unsaturated compounds by irradiation of active light. Examples of sensitizers are benzophenone, Michler's ketone, benzoin, benzoin alkyl ethers, anthraquinone, alkyl substituted anthraquinones, benzil, cobalt naphthenate, and the like.

The photosensitive composition comprising (a) 20 to 70 parts by weight of a linear polymer or copolymer having tetrahydrofurfuryl groups at side chains, (b) 20 to 60 parts by weight of one or more photopolymerizable unsaturated compounds having at least two terminal ethylene groups, and (c) 1 to 10 parts by weight of one or more sensitizers which initiate polymerization of said unsaturated compound by irradiation of active light, is preferable because of showing excellent physical and chemical properties.

The photosensitive resin composition of this invention may contain additives such as heat polymerization inhibitors to improve storage stability, reactive plasticizers, e.g., polypropylene glycol monoacrylates to improve film properties, dyes, pigments, fillers, flame retardants and the like.

The photosensitive resin composition of this invention has excellent storage stability and is stable over 4 months at 40° C. and over 1 hour at 110° C.

Protective films can be formed from the photosensitive resin composition of this invention using a conventional method. For example, the photosensitive resin composition is dissolved in an organic solvent such as methyl ethyl ketone, toluene, methyl Cellosolve, chloroform, or the like to prepare a photosensitive solution containing 3 to 60% by weight of the photosensitive resin composition, which forms a photosensitive layer on a substrate to be protected according to the following conventional method (1) or (2):

(1) The photosensitive solution is coated on a substrate and dried.

(2) The photosensitive solution is coated on a film such as a polyethylene terephthalate film and dried. Then the resulting film is laminated on a substrate using heated rolls.

If a substrate to be protected has a rough surface like a printed circuit board, it is preferable to laminate the treated film on the substrate under vacuum below 200 mmHg in order to prevent the laminate from inclusion of air.

Subsequently, the substrate is exposed to conventional active light such as ultraviolet light through a mask or negative to cure the exposed image areas, followed by development using a solvent such as 1,1,1-trichloroethane in order to wash the unexposed areas. The resulting imaged protective film can be resists for conventional etching, plating and the like. If the protective film is further cured after the development, for example, by exposing to active light and heat treatment at 80° to 200° C. for 10 minutes to 2 hours, properties of the protective film are further improved. That is, the protective film obtained by further exposure to active light and heat treatment is remarkably resistant to solvents such as aromatic hydrocarbons, e.g., toluene, ketones, e.g., methyl ethyl ketone, alcohols, e.g., isopropyl alcohol, halogenated hydrocarbons, e.g., methylene dichloride, and also resistant to strong acidic and alkaline aqueous solutions. Further since the protective film is excellent in heat resistance and mechanical strengths, it may be used as permanent protective films such as a solder resist and the like.

Further since the photosensitive resin composition of this invention has excellent photosensitivity and chemical and physical properties, it may be used as a photosensitive adhesive, a plastic relief, a paint or varnish, and a printing plate.

The invention is illustrated but not limited by the following Examples in which parts are by weight.

EXAMPLE 1

| Ingredients: | Parts |
|---|---|
| Copolymer of tetrahydrofurfuryl methacrylate, methyl methacrylate and methacrylic acid (weight ratio 20: 78: 2) having molecular weight of 140,000 | 50 |
| Trimethylolpropane triacrylate | 30 |
| Polypropylene glycol (average molecular weight 1000) diacrylate | 10 |
| Benzophenone | 2.7 |
| Michler's ketone | 0.3 |
| p-Methoxyphenol | 0.5 |

-continued

| Ingredients: | Parts |
|---|---|
| Methyl ethyl ketone | 200 |

The photosensitive resin composition having the above-mentioned ingredients was prepared and coated on a copper-clad laminate and dried at room temperature for 10 minutes and at 80° C. for 10 minutes to form a photosensitive layer of 30μ thick.

Then the photosensitive layer was exposed to a 3 kW high pressure mercury lamp (manufactured by Ohku Seisakusho Co., Ltd.) through a negative mask with irradiation intensity of 4000 $\mu W/cm^2$ for 40 seconds. After allowed to stand at room temperature for 30 minutes, spray development was carried out using 1,1,1-trichloroethane for 1 minute. After removing the solvent from the surface using an air gun, the whole surface was exposed to the same mercury lamp with irradiation intensity of 40 $mW/cm^2$ for 30 minutes without using the negative, followed by heat treatment at 150° C. for 60 minutes. Thus a protective film having precise image corresponding to the negative mask was obtained.

The protective film was not changed after immersed for 1 hour each in isopropanol, toluene, methyl ethyl ketone, trichloroethylene and a 50% aqueous solution of sulfuric acid. When the protective film was immersed in a soldering bath at 260°-270° C. for 2 minutes, it was stable without producing cracks and release from the copper foil. This means that the protective film can be used as a solder resist sufficiently.

The photosensitive resin composition was excellent in storage stability and was stable over 6 months at 40° C. in the varnish state and in the film state.

EXAMPLE 2

| Ingredients | Parts |
|---|---|
| Copolymer of tetrahydrofurfuryl methacrylate, ethyl methacrylate and 2-hydroxyethyl methacrylate (weight ratio 40: 55: 5) having molecular weight of 80,000 | 50 |
| Pentaerythritol triacrylate | 30 |
| Polyproplyene glycol (average molecular weight 1000) monoacrylate | 10 |
| Benzophenone | 2.7 |
| Michler's ketone | 0.3 |
| p-Methoxyphenol | 0.5 |
| Crystal violet | 0.1 |
| Toluene | 200 |

The photosensitive resin composition having the above-mentioned ingredients was prepared and coated on a polyethylene terephthalate film of 25μ thick and dried to form a photosensitive layer of 100μ thick.

The thus treated film was laminated on a latticed copper pattern (a glass epoxy laminate of 70μ thick having copper parts of line breadth 1 mm and line spacing 1 mm) applying pressure using heated rolls at 100° C. under vacuum of below 60 mmHg. Then the laminate was aged at 80°-110° C. for 5 to 15 minutes. After allowed to stand at room temperature for 30 minutes, the photosensitive layer was exposed to light for 40 seconds, developed for 1 minute, exposed to light again for 3 minutes and finally heat treated at 130° C. for 1 hour in the same manner as described in Example 1. The resulting protective film had excellent resistance to solvents and heat resistance and can be used as a solder resist. Storage stability of the composition was also excellent in the same degree as the composition of Example 1.

EXAMPLE 3

| Ingredients | Parts |
|---|---|
| Poly(tetrahydrofurfuryl methacrylate) having molecular weight of 70,000 | 50 |
| 2,2-Bis(4-methacryloxyethoxyphenyl)-propane | 45 |
| 2-Ethylanthraquinone | 5 |
| p-Methoxyphenol | 0.5 |
| Victoria pure blue | 0.1 |
| Methyl ethyl ketone | 200 |

The photosensitive resin composition having the above-mentioned ingredients was prepared and an excellent permanent protective film was obtained in the same manner as described in Example 1.

EXAMPLE 4

| Ingredients | Parts |
|---|---|
| Copolymer of tetrahydrofurfuryl acrylate, and tetrahydrofurfuryl methacrylate (weight ratio 20: 80) having molecular weight of 120,000 | 40 |
| Pentaerythritol tetracrylate | 25 |
| Polyethylene glycol (average molecular weight 1000) dimethacrylate | 25 |
| Benzoin ethyl ether | 7 |

The photosensitive resin composition having the above-mentioned ingredients was prepared and an excellent permanent protective film was obtained in the same manner as described in Example 2.

EXAMPLES 5-8

| Ingredients | Parts |
|---|---|
| Copolymer of tetrahydrofurfuryl methacrylate, t-butyl methacrylate, styrene and methyl methacrylate (weight ratio 15: 10: 10: 65) having molecular weight of 160,000 | 45 |
| Benzophenone | 2.5 |
| Michler's ketone | 0.5 |
| Methyl ethyl ketone | 200 |

The photosensitive resin compositions having the above-mentioned ingredients and unsaturated compounds as listed in Table 1 were prepared and excellent permanent protective films were obtained in the same manner as described in Example 2. These compositions had excellent storage stability.

TABLE 1

| Example No. | Polyfuctional unsaturated compound | | Bifunctional unsaturated compound | |
|---|---|---|---|---|
| 5 | Pentaerythritol trimethacrylate | 30 parts | Polytetramethylene glycol (average molecular weight 1000 diacrylate | 15 parts |
| 6 | Pentaerythritol triacrylate | 30 parts | Polytetramethylene glycol (average molecular weight 1000 diacrylate | 15 parts |
| 7 | Trimethylolethane triacrylate | 30 parts | Polytetramethylene glycol (average molecular weight 1000) dimethacrylate | 20 parts |
| 8 | Trimethylolpropane triacrylate | 30 parts | Polytetramethylene glycol (average molecular weight 1000) dimethacrylate | 20 parts |

EXAMPLE 9

| Ingredients | Parts |
|---|---|
| Copolymer of tetrahydrofurfuryl methacrylate, 2-hydroxyethyl methacrylate, 2 acid phosphoxyethyl methacrylate and methyl methacrylate (weight ratio 10: 2: 0.1: 88) having molecular weight of 140,000 | 50 |
| Pentaerythritol triacrylate | 30 |
| 2,2-Bis(4-methacryloxyethoxyphenyl)-propane | 15 |
| Benzophenone | 2.7 |
| Michler's ketone | 0.3 |
| p-Methoxyphenol | 0.5 |
| Methyl ethyl ketone | 120 |

The photosensitive resin composition having the above-mentioned ingredients was prepared and coated on a copper-clad laminate and dried at room temperature for 10 minutes and at 80° C. for 10 minutes to form a photosensitive layer of 30μ thick.

Then the photosensitive layer was exposed to a 3 kW high pressure mercury lamp (manufactured by Ohku Seisakusho Co., Ltd.) through a negative mask with irradiation intensity of 4000 $\mu W/cm^2$ for 90 seconds. After allowed to stand at room temperature for 30 minutes, spray development was carried out using 1,1,1-trichloroethane for 90 seconds. After removing the solvent from the surface using an air gun, the whole surface was exposed to the same mercury lamp with irradiation intensity of 4000 $\mu W/cm^2$ for 30 minutes without using the negative, followed by heat treatment at 150° C. for 20 minutes. Thus a protective film having precise image corresponding to the negative mask was obtained.

The protective film had excellent adhesion and resistance to solvents, and showed no change after immersed in trichloroethylene vapor for 5 minutes. When the protective film was immersed in a soldering bath at 260°-270° C. for 1 minute, it was stable without producing cracks and release from the copper foil. This means that the protective film can be used as a solder resist sufficiently.

The photosensitive resin composition was excellent in storage stability and was stable over 6 months at 40° C. in the varnish state and in the film state.

EXAMPLE 10

| Ingredients | Parts |
|---|---|
| Copolymer of tetrahydrofurfuryl methacrylate, 2 acid phosphoxyethyl acrylate, β-hydroxyethyl methacrylate and methyl methacrylate (weight ratio 15 : 0.2 : 5 : 80) having molecular weight of 150,000 | 50 |
| Condensate obtained from phthalic acid, diethylene glycol and acrylic acid (molar ratio 1: 2: 2) | 25 |
| Trimethylolpropane triacrylate | 25 |
| Benzophenone | 2.7 |
| Michler's ketone | 0.3 |
| p-Methoxyphenol | 0.6 |
| Toluene | 140 |
| Methyl ethyl ketone | 60 |

The photosensitive resin composition having the above-mentioned ingredients was prepared and coated on a polyethylene terephthalate film of 25μ thick and dried to form a photosensitive layer of 100μ thick. The thus treated film was laminated on a latticed copper pattern (a glass epoxy laminate of 70μ thick having copper parts of line breadth 1 mm and line spacing 1 mm) applying pressure using heated rolls at 100° C. under vacuum of below 60 mmHg. After allowed to stand at room temperature for 30 minutes, the photosensitive layer was exposed to the mercury lamp for 90 seconds, developed for 90 seconds, exposed to the mercury lamp again for 3 minutes and finally heat treated at 130° C. for 20 minutes in the same manner as described in Example 9. The resulting protective film had excellent resistance to solvents and heat resistance and can be used as a solder resist. Storage stability of the composition was also excellent in the same degree as the composition of Example 9.

EXAMPLES 11-14

| Ingredients | Parts |
|---|---|
| Condensate obtained from trimethylolpropane, tetrahydrophthalic acid, diethylene glycol, and acrylic acid (molar ratio 1: 3: 3: 3) | 45 |
| Benzophenone | 2.7 |
| Michler's ketone | 0.3 |
| p-Methoxyphenol | 0.5 |
| Methyl ethyl ketone | 200 |

The photosensitive resin compositions having the above-mentioned ingredients and linear copolymers are listed in Table 2 were prepared and excellent permanent protective films were obtained in the same manner as described in Example 10.

TABLE 2

| Example No. | Linear copolymer | |
|---|---|---|
| 11 | Copolymer of tetrahydrofurfuryl methacrylate, 2-acid phosphoxyethyl methacrylate, β-hydroxyethyl methacrylate, methacrylic acid and methyl methacrylate (weight ratio 20: 0.1: 2: 78) having molecular weight of 100,000 | 50 parts |
| 12 | Copolymer of tetrahydrofurfuryl methacrylate, 2-acid phosphoxyethyl methacrylate and β-hydroxyethyl methacrylate (weight ratio 90: 0.1: 10) having molecular weight of 100,000 | 50 parts |
| 13 | Copolymer of tetrahydrofurfuryl acrylate, 2-acid phosphoxyethyl acrylate, β-hydroxyethyl acrylate and methyl methacrylate (weight ratio 10: 0.5: 5: 85) having molecular weight of 120,000 | 50 parts |
| 14 | Copolymer of tetrahydrofurfuryl methacrylate, 2-acid phosphoxyethyl acrylate, polypropylene gylcol (n = 6) monomethacrylate and tribromophenyl acrylate (weight ratio 40: 0.1: 10: 50) having molecular weight of 120,000 | 50 parts |

Comparative Example

Storage stability of the photosensitive resin compositions of Examples 1-14 was compared with the composition disclosed in Japanese Patent Application Kokai (Laid-Open) No. 144431/75 containing an epoxy resin and a latent curing agent as mentioned below:

| Ingredients | Parts |
|---|---|
| Copolymer of tetrahydrofurfuryl methacrylate and methyl methacrylate (weight ratio 20: 80) having molecular weight of 120,000 | 40 |
| Pentaerythritol triacrylate | 30 |
| Epoxy resin (ECN 1280, product of CIBA Ltd.) | 25 |
| Boron trifluoride monoethylamine | 2.5 |
| Benzophenone | 2.7 |
| Michler's ketone | 0.3 |
| p-Methoxyphenol | 0.6 |

Each photosensitive resin composition was coated on a polyethylene terephthalate film of 25μ thick and dried at room temperature for 10 minutes and at 80° C. for 10 minutes to form a photosensitive layer of 100μ thick, which was allowed to stand for the desired period at 40° C. Then the film was laminated on a copperclad laminate using heated rolls applying heat and pressure. Then the photosensitive layer was exposed to a 3 kW high pressure mercury lamp (Manufactured by Ohku Seisakusho Co., Ltd.) through a negative mask with irradiation intensity of 4000 $\mu W/cm^2$ for 2 minutes. After cooling, spray development was carried out for 2 minutes using 1,1,1-trichloroethane. Storage stability was evaluated by measuring photosensitivity and observing changes during the development.

After stored for 3 weeks at 40° C., the composition of Kokai No. 144431/75 produced gels partly and the unexposed areas became insoluble to the development solution. It was very difficult to form images on the film.

On the contrary, each composition of this invention produced no change in photosensitivity and developing ability after stored at 40° C. for 4 months, and it was possible to form protective films having precise images corresponding to the negative mask used.

What is claimed is:

1. A photosensitive resin composition consisting essentially of (a) 20 to 70 parts by weight of a polymer selected from the group consisting of a linear polymer having tetrahydrofurfuryl groups at side chains and a linear copolymer having tetrahydrofurfuryl groups at side chains, wherein the tetrahydrofurfuryl groups at side chains is contained in the polymer in a proportion of at least 0.007 mole/100 g, (b) 20 to 60 parts by weight of one or more photopolymerizable unsaturated compounds having at least two terminal ethylene groups, and (c) 1 to 10 parts by weight of one or more sensitizers which initiate polymerization of said unsaturated compounds by irradiation of active light.

2. A composition according to claim 1, wherein said polymer is a linear polymer having tetrahydrofurfuryl groups at side chains of a compound of the formula:

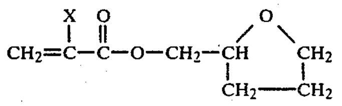 (I)

wherein X is a hydrogen atom, a lower alkyl group or a halogen atom.

3. A composition according to claim 1, wherein said polymer is a linear copolymer having tetrahydrofurfuryl groups at side chains of a compound of the formula:

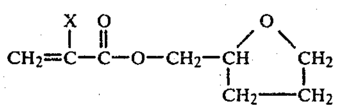 (I)

wherein X is a hydrogen atom, a lower alkyl group or a halogen atom, and a compound of the formula:

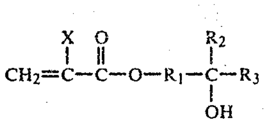 (II)

wherein X is as defined above; $R_1$ is a group of the formula

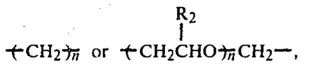

in which n is an integer of 1 to 20; $R_2$ is a hydrogen atom, a lower alkyl group or a group of the formula $-CH_2Cl$; and $R_3$ is a hydrogen atom, a lower alkyl group or a group of the formula $-CH_2OR_2$.

4. A composition according to claim 1, wherein said polymer is a linear copolymer having tetrahydrofurfuryl groups at side chains of a compound of the formula:

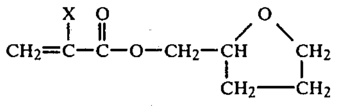 (I)

wherein X is a hydrogen atom, a lower alkyl group or a halogen atom, and one or more vinyl monomers.

5. A composition according to claim 1, wherein said polymer is a linear copolymer having tetrahydrofurfuryl groups at side chains of a compound of the formula:

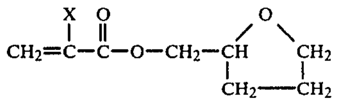 (I)

wherein X is a hydrogen atom, a lower alkyl group or a halogen atom, a compound of the formula:

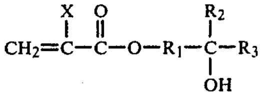 (II)

wherein X is as defined above; $R_1$ is a group of the formula

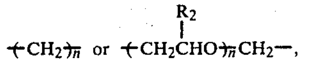

in which n is an integer of 1 to 20; $R_2$ is a hydrogen atom, a lower alkyl group or a group of the formula $CH_2Cl$; and $R_3$ is a hydrogen atom, a lower alkyl group or a group of the formula $CH_2OR_2$, and one or more vinyl monomers.

6. A composition according to claim 2, wherein the linear polymer is a linear polymer of tetrahydrofurfuryl methacrylate or tetrahydrofurfuryl acrylate.

7. A composition according to claim 1, wherein said polymer is a linear copolymer having tetrahydrofurfuryl groups at side chains of tetrahydrofurfuryl methacrylate and tetrahydrofurfuryl acrylate.

8. A composition according to claim 4, wherein the linear copolymer having tetrahydrofurfuryl groups at side chains is a linear copolymer of at least one of the compounds tetrahydrofurfuryl methacrylate and tetrahydrofurfuryl acrylate, and methyl methacrylate.

9. A composition according to claim 1, wherein the one or more photopolymerizable unsaturated compounds are a mixture of an acrylic or methacrylic acid ester of polyvalent alcohol selected from the group consisting of pentaerythritol, trimethylolpropane and trimethylolethane and an acrylic or methacrylic acid ester of bivalent alcohol selected from the group consisting of polyethylene glycol, polyethylene glycol and polytetramethylene glycol.

10. A composition according to claim 1, wherein the one or more photopolymerizable unsaturated compounds are a mixture of an acrylic acid ester of pentaerythritol and an acrylic acid ester of polypropylene glycol.

11. A composition according to claim 1, wherein the one or more photopolymerizable unsaturated compunds are a mixture of an acrylic acid ester of pentaerythritol. and an acrylic acid ester of polyethylene glycol.

12. A composition according to claim 1, wherein the one or more photopolymerizable unsaturated compounds are a mixture of trimethylolpropane triacrylate and polyethylene glycol diacrylate.

13. A composition according to claim 1, wherein said polymer is a linear copolymer having tetrahydrofurfuryl groups at side chains of a compound of the formula:

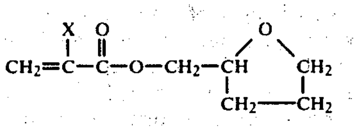 (I)

wherein X is a hydrogen atom, a lower alkyl group or a halogen atom, a compound of the formula:

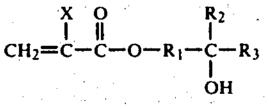 (II)

wherein X is as defined above; $R_1$ is a group of the formula

in which n is an integer of 1 to 20; $R_2$ is a hydrogen atom, a lower alkyl group or a group of the formula $-CH_2Cl$ and $R_3$ is a hydrogen atom, a lower alkyl group or a group of the formula $-CH_2OR_2$, and a compound of the formula:

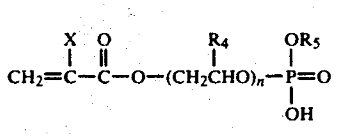 (III)

wherein X is as defined above; $R_4$ is a hydrogen atom, a lower alkyl group or a group of the formula $-CH_2ClR_5$ is hydrogen or a lower alkyl group; and n is an integer of 1 to 20.

14. A composition according to claim 1, wherein the linear copolymer is a copolymer of (A) 2 to 90 parts by weight of a compound of the formula:

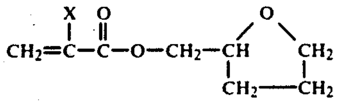 (I)

wherein X is a hydrogen atom, a lower alkyl group or a halogen atom, (B) 1 to 20 parts by weight of a compound of the formula:

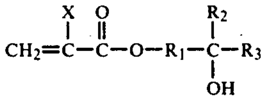 (II)

wherein X is as defined above; $R_1$ is a group of the formula

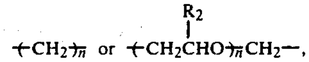

in which n is an integer of 1 to 20; $R_2$ is a hydrogen atom, a lower alkyl group or a group of the formula $-CH_2Cl$; and $R_3$ is a hydrogen atom, a lower alkyl group or a group of the formula $-CH_2OR_2$, (C) 0.02 to 1 part by weight of a compound of the formula:

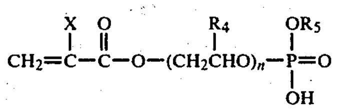 (III)

wherein X is as defined above; $R_4$ is a hydrogen atom, a lower alkyl group or a group of the formula $-CH_2Cl$; $R_5$ is a hydrogen or lower alkyl group; and n is an integer of 1 to 20, and (D) 0 to 85 parts by weight of one or more vinyl monomers.

15. A composition according to claim 1, wherein the one or more photopolymerizable unsaturated compounds are low molecular weight polyester resins having at least one of acryloyl groups and methacryloyl groups at end groups.

16. A composition according to claim 1, wherein the one or more photopolymerizable unsaturated compounds are a condensate of phthalic acid, diethylene glycol and acrylic acid.

17. A composition according to claim 1, wherein the one or more photopolymerizable unsaturated compounds are a condensate of trimethylolpropane, tetrahydrophthalic acid, diethylene glycol and acrylic acid.

18. A composition according to claim 1, wherein said polymer is a linear copolymer having tetrahydrofurfuryl groups at side chains of a compound of the formula:

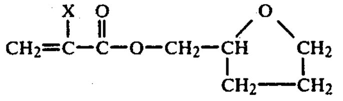 (I)

wherein X is a hydrogen atom, a lower alkyl group or a halogen atom, a compound of the formula:

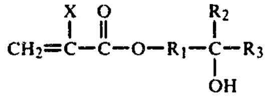 (II)

wherein X is as defined above; $R_1$ is a group of the formula

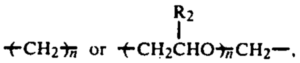

in which n is an integer of 1 to 20, $R_2$ is a hydrogen atom, a lower alkyl group or a group of the formula $—CH_2Cl$; and $R_3$ is a hydrogen atom, a lower alkyl group or a group of the formula $—CH_2OR_2$, and a compound of the formula:

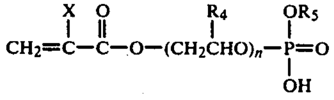 (III)

wherein X is as defined above; $R_4$ is a hydrogen atom, a lower alkyl group or a group of the formula $—CH_2Cl$; $R_5$ is hydrogen or a lower alkyl group; and n is an integer of 1 to 20, and 1 or more vinyl monomers.

19. A composition according to claim 18, wherein said one or more vinyl monomers are selected from the group consisting of alkyl acrylates or methacrylates, acrylic acid, methacrylic acid, itaconic acid, styrene, α-methyl styrene, glycidyl methacrylate, t-butylaminoethyl methacrylate, dimethylamino methacrylate, 2,3-dibromopropyl methacrylate, acrylamide, and tribromophenyl acrylate.

20. A composition according to claim 13, wherein said polymer has a molecular weight of 10,000 to 600,000.

21. A composition according to claim 14, wherein the linear copolymer is a copolymer of (A) 5 to 40 parts by weight of a compound of the formula:

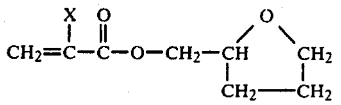 (I)

wherein X is a hydrogen atom, a lower alkyl group or a halogen atom; (B) 2–10 parts by weight of a compound of the formula:

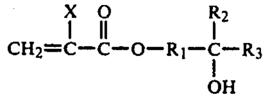 (II)

wherein X is as defined above; $R_1$ is a group of the formula

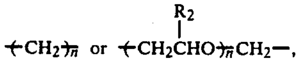

in which n is an integer of 1 to 20; $R_2$ is a hydrogen atom, a lower alkyl group or a group of the formula $—CH_2Cl$; and $R_3$ is a hydrogen atom, a lower alkyl group or a group of the formula $—CH_2OR_2$; (C) 0.05–0.2 part by weight of a compound of the formula:

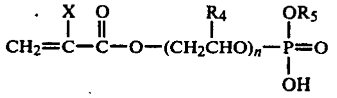 (III)

wherein X is as defined above; $R_4$ is a hydrogen atom, a lower alkyl group or a group of the formula $—CH_2Cl$; $R_5$ is hydrogen or a lower alkyl group; and n is an integer of 1 to 20; and (D) 0–85 parts by weight of one or more vinyl monomers.

22. A composition according to claim 1, wherein said one or more photopolymerizable unsaturated compounds comprise a mixture of trifunctional unsaturated compound and a bifunctional unsaturated compound.

23. A composition according to claim 1, wherein said one or more sensitizers is selected from the group consisting of benzophenone, Michler's ketone, benzoin, benzoin alkyl ethers, anthraquinone, alkyl substituted anthraquinones, benzil, and cobalt naphthenate.

* * * * *